United States Patent
Lin

(10) Patent No.: US 10,666,197 B1
(45) Date of Patent: May 26, 2020

(54) LOW NOISE CRYSTAL OSCILLATOR AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

(*) Notice: Subject to any disclaimer, the term of this patent is extended or adjusted under 35 U.S.C. 154(b) by 0 days.

(21) Appl. No.: 16/429,299

(22) Filed: Jun. 3, 2019

(51) Int. Cl.
*H03B 5/36* (2006.01)
*H03B 1/04* (2006.01)

(52) U.S. Cl.
CPC .............. *H03B 5/364* (2013.01); *H03B 1/04* (2013.01); *H03B 2200/0008* (2013.01)

(58) Field of Classification Search
CPC .. H03B 5/36; H03B 5/364; H03B 2200/0008; H03B 2202/012
See application file for complete search history.

(56) References Cited

U.S. PATENT DOCUMENTS

| 4,527,131 A | * | 7/1985 | Herold | ................ H03B 5/364 331/116 FE |
| 10,063,188 B2 | * | 8/2018 | Srinivas | .................. H03L 5/02 |

OTHER PUBLICATIONS

Filanovsky, I. M., J. Järvenhaara, and N. T. Tchamov. "Source follower: A misunderstood humble circuit." 2013 IEEE 56th International Midwest Symposium on Circuits and Systems (MWSCAS). IEEE, 2013. (Year: 2013).*

* cited by examiner

*Primary Examiner* — Ryan Johnson
(74) *Attorney, Agent, or Firm* — McClure, Qualey & Rodack, LLP

(57) ABSTRACT

A circuit and method include using a first source follower of a first type to receive a first voltage from a first node and output a first current to a third node; using a second source follower of a second type to receive a second voltage from a second node and output a second current to the third node; using an AC (alternate current) coupling capacitor to couple the first node to the second node; using a feedback capacitor to couple the third node to the first node; using a shunt capacitor to shunt the third node to an AC ground; using a crystal to shunt the first node to an AC ground; providing a first bias voltage to the first node via a first DC (direct current) coupling resistor; and providing a second bias voltage to the second node via a second DC coupling resistor.

10 Claims, 3 Drawing Sheets

US 10,666,197 B1

LOW NOISE CRYSTAL OSCILLATOR AND METHOD THEREOF

BACKGROUND OF THE DISCLOSURE

Field of the Disclosure

The present disclosure generally relates to crystal oscillator circuits and more particular to low-noise crystal oscillator circuits and methods.

Description of Related Art

As depicted in FIG. 1, a prior art, Colpitts-type, crystal oscillator (also referred to herein as simply a "Colpitts crystal oscillator") 100 comprises: two PMOS (p-channel metal oxide semiconductor) transistors 101 and 102; two capacitors 121 and 122; one resistor 131; and one crystal 111. Here, "$V_{G1}$" and "$V_{G2}$" denote a first bias voltage and a second bias voltage, respectively. Throughout this disclosure, "$V_{DD}$" denote a power supply node, while "$V_{SS}$" denotes a ground node. The Colpitts-type crystal oscillator 100 is well known to those of ordinary skill in the art, and thus is not explained in detail here. PMOS transistor 101 embodies a source follower used to sustain an oscillation, while PMOS transistor 102 embodies a current source used to establish a bias current "$I_b$" needed by the source follower. In an alternative embodiment not shown in figure, the two PMOS transistors 101 and 102 are replaced by two NMOS transistors, while the power supply node "$V_{DD}$" and the ground node "$V_{SS}$" are swapped; this alternative embodiment is also well known to those of ordinary skills in the art and thus not described in detail here.

A drawback is manifest in the Colpitts crystal oscillator 100. Specifically, PMOS transistor 102, which is used for providing the bias current "$I_b$," is a major contributor of noise. Although the PMOS transistor 102 can be replaced by an inductor, the inductor needs to have a large inductance in order to have a high impedance comparable to an output impedance of the PMOS transistor 102. Such a large-inductance inductor is usually impractical.

What is desired are circuits and methods to generate and sustain oscillation, without having low noise.

SUMMARY OF THE DISCLOSURE

In an embodiment, an oscillator comprises a crystal, a first source follower transistor of a first type, a second source follower transistor of a second type, an AC (alternate current) coupling capacitor, a feedback capacitor, a shunt capacitor, a first DC (direct current) coupling resistor, and a second DC coupling resistor, wherein: the first source follower of the first type comprises a PMOS (p-channel metal oxide semiconductor) transistor, receives a first voltage from a first node, and outputs a first current to a third node; the second source follower of the second type comprises a NMOS (n-channel metal oxide semiconductor) transistor, receives a second voltage from a second node, and outputs a second current to the third node; the AC coupling capacitor is configured to couple the first node to the second node; the feedback capacitor is configured to couple the third node to the first node; the shunt capacitor is configured to shunt the third node to an AC (alternate current) ground; the crystal is configured to shunt the first node to an AC ground; the first DC coupling resistor is configured to couple a first bias voltage to the first node; and the second DC coupling resistor is configured to couple a second bias voltage to the second node.

In an embodiment, a method comprises: using a first source follower transistor of a first type to receive a first voltage from a first node and output a first current to a third node; using a second source follower transistor of a second type to receive a second voltage from a second node and output a second current to the third node; using an AC (alternate current) coupling capacitor to couple the first node to the second node; using a feedback capacitor to couple the third node to the first node; using a shunt capacitor to shunt the third node to an AC ground; using a crystal to shunt the first node to an AC ground; providing a first bias voltage to the first node via a first DC (direct current) coupling resistor; and providing a second bias voltage to the second node via a second DC coupling resistor.

DETAILED DESCRIPTION OF THIS DISCLOSURE

The present disclosure is directed to crystal oscillators. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "power node," "ground node," "crystal," "source follower," "voltage," "current," "CMOS (complementary metal oxide semiconductor)," "PMOS (P-channel metal oxide semiconductor) transistor," "NMOS (N-channel metal oxide semiconductor) transistor," "resistor," "capacitor," "oscillator," "AC (alternate current)," "DC (direct current)," "AC ground," and "bias." Terms and basic concepts like these are apparent to those of ordinary skill in the art and thus will not be explained in detail here. Those of ordinary skill in the art can also recognize symbols of PMOS transistor and NMOS transistor, and identify the "source," the "gate," and the "drain" terminals thereof, and understands meanings of units such as "MOhm (mega-Ohm)," "pF (pico-Farad)," "nm (nanometer)," and "μm (micron)" without the need of explanation herein.

The contents of the present application are presented in an engineering sense. For instance, "X is equal to Y" means "a difference between X and Y is smaller than a specified engineering tolerance"; "X is much smaller than Y" means "X divided by Y is smaller than an engineering tolerance"; and "X is zero" means "X is smaller than a specified engineering tolerance."

Throughout this disclosure, a DC (direct-current) node is a circuit node of a substantially fixed electrical potential (i.e. voltage). A power node and a ground node are both considered a DC node. A power node is denoted by "$V_{DD}$." A ground node is denoted by "$V_{SS}$." A DC node is said to be an "AC (alternate current) ground," because an AC (alternate current) voltage of said node is substantially zero. Therefore, both a power node and a ground node are considered an "AC ground."

Figure 1:
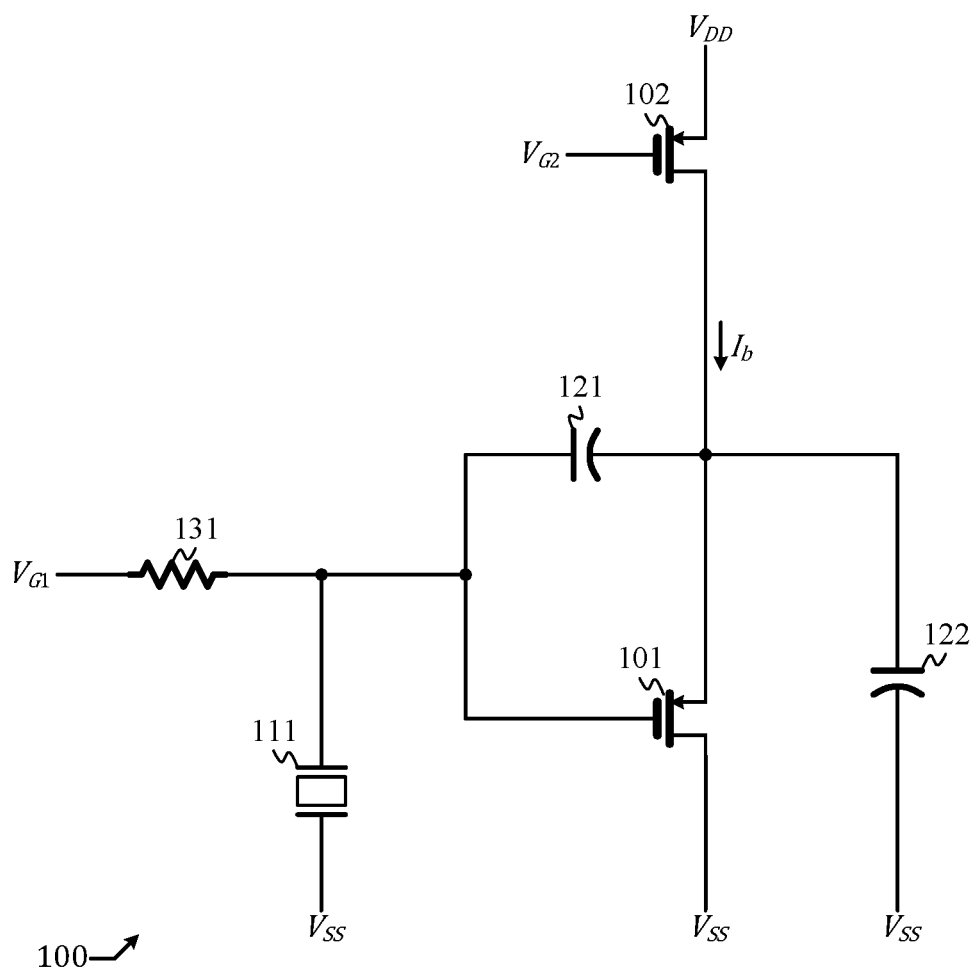
FIG. 1 shows a schematic diagram of a prior art Colpitts crystal oscillator.
Figure 2:
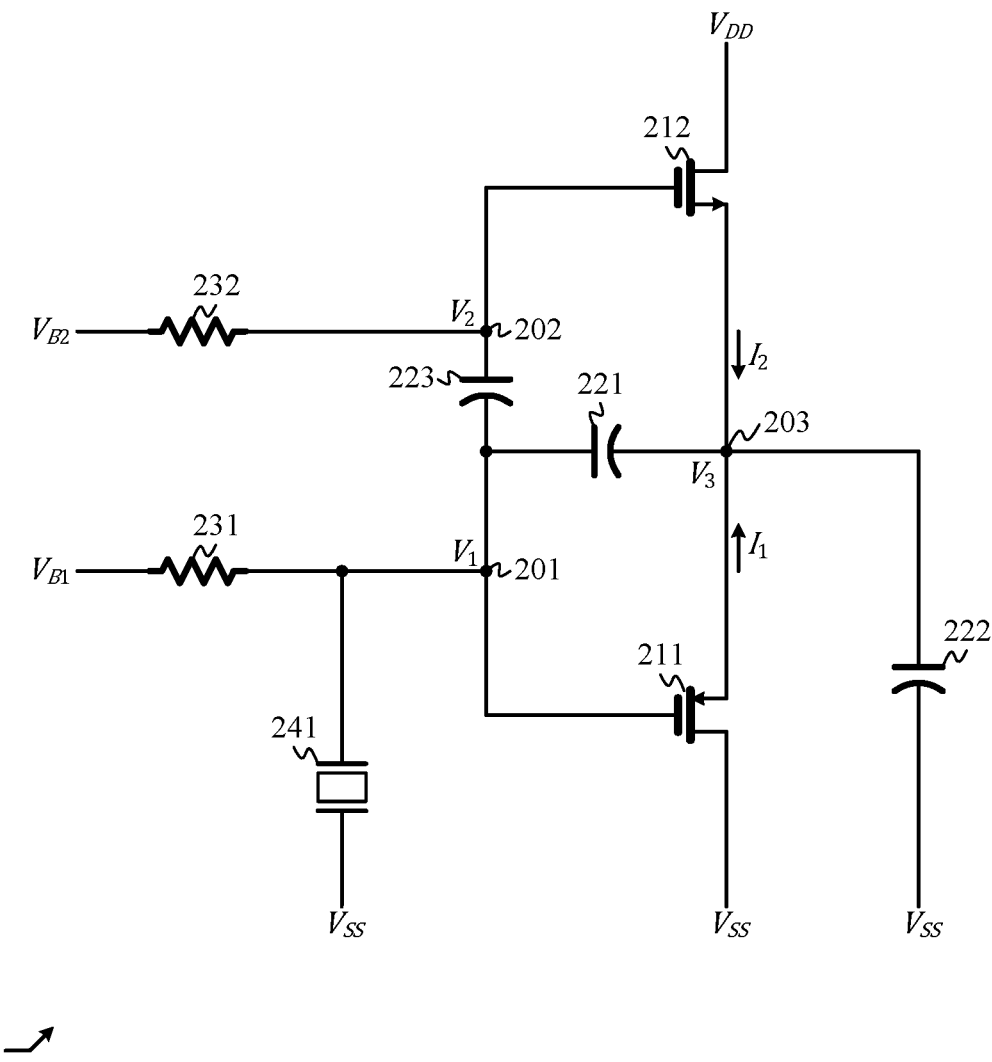
FIG. 2 shows a schematic diagram of an oscillator in accordance with an embodiment of the present invention.

A schematic diagram of an oscillator 200 in accordance with an embodiment of the present disclosure is depicted in FIG. 2. Oscillator 200 comprises: a crystal 241; a PMOS transistor 211; an NMOS transistor 212; a feedback capacitor 221; a shunt capacitor 222; an AC (alternate current) coupling capacitor 223; a first DC (direct current) coupling resistor 231; and a second DC coupling resistor 232. PMOS transistor 211 is configured as a first source follower configured to receive a first voltage "$V_1$" from a first node 201 and output a first current "$I_1$" to a third node 203. NMOS transistor 212 is configured as a second source follower configured to receive a second voltage "$V_2$" from a second node 202 and output a second current "$I_2$" to the third node 203. AC coupling capacitor 223 is configured to provide an AC coupling between the first node 201 and the second node 202 so that the first voltage "$V_1$" and the second voltage "$V_2$" have approximately the same AC level. In other words, the first node 201 and the second node 202 are effectively shorted, as far as an AC component of a voltage thereof is concerned.

Feedback capacitor 221 is configured to provide a capacitive feedback from the third node 203 to the first node 201. Shunt capacitor 222 is configured to shunt the third node 203 to the ground node "$V_{SS}$." The first DC coupling resistor 231 is configured to couple a first bias voltage "$V_{B1}$" to the first node 201. The second DC coupling resistor 232 is configured to couple a second bias voltage "$V_{B2}$" to the second node 202. Crystal 241 is configured to shunt the first node 201 to the ground node "$V_{SS}$." PMOS transistor 211 and NMOS transistor 212 receive effectively the same AC voltage, and jointly establish a third voltage "$V_3$" at the third node 203. Therefore, the first source follower embodied by PMOS transistor 211 and the second source follower embodied by NMOS transistor 212 can jointly sustain an oscillation. However, there is no dedicated current source needed for either PMOS transistor 211 or NMOS transistor 212, since there are configured in a back-to-back stack topology, and thus effectively provide a bias current to each another. Unlike the Colpitts crystal oscillator 100, which has a dedicated current source (embodied by PMOS transistor 102) that contributes noise but does not contribute to sustaining an oscillation, every transistor in oscillator 200 contributes to sustaining an oscillation. Therefore, oscillator 200 is superior to the Colpitts crystal oscillator 100.

Although it is shown that crystal 241 shunts the first node 201 to the ground node "$V_{SS}$," it must be understood that this is just an example but not limitation. In fact, the ground node "$V_{SS}$" is merely an example of an AC ground, and the present invention will still work if crystal 241 shunts the first node 201 to a different AC ground other than the ground node "$V_{SS}$." Likewise, the present invention will still work if the shunt capacitor 222 shunts the third node 203 to a different AC ground other than the ground node "$V_{SS}$."

In a first alternative embodiment (not shown in figure), feedback capacitor 221 connects the third node 203 to the second node 202 (instead of to the first node 201 as shown in FIG. 2). In a second alternative embodiment, the crystal 241 shunts the second node 202 (instead of the first node 201 as shown in FIG. 2) to the ground node "$V_{SS}$." These two alternative embodiments are both equivalent to the embodiment shown in FIG. 2, since the first node 201 and the second node 202 are virtually shorted by the AC coupling capacitor 223, therefore the feedback capacitor 221 connecting to the first node 201 is virtually equivalent to connecting to the second node 202, while the crystal 241 shunting the first node 201 to the ground node "$V_{SS}$" is virtually equivalent to the crystal 241 shunting the second node 202 to the ground node "$V_{SS}$."

A resistance of the first DC coupling resistor 231 must be substantially greater than an impedance of the first node 201. Otherwise, it could adversely load down the first node 201 and impede oscillation. Likewise, a resistance of the second DC coupling resistor 232 must be substantially greater than an impedance of the second node 202. Otherwise, it could adversely load down the second node 202 and impede oscillation.

For the AC coupling capacitor 223 to effectively short the first node 201 to the second node 202, an impedance of the AC coupling capacitor 223 must be substantially smaller than an input impedance looking into the gate of NMOS transistor 212.

By way of example but not limitation, in an embodiment, oscillator 200 is fabricated using a 28 nm CMOS (complementary metal oxide semiconductor) process; a resonant frequency of crystal 241 is 80 MHz; the W/L (width/length) of NMOS transistors 212 is 500 µm/220 nm; the W/L of PMOS transistor 211 is 750 µm/220 nm; feedback capacitor 221 is 18 pF; shunt capacitor 222 is 18 pF; AC coupling capacitor 223 is 10 pF; "$V_{DD}$" is 1.5V; "$V_{SS}$" is 0V; both resistors 231 and 232 are 1 MOhm; "$V_{B1}$" is 375 mV; and "$V_{B2}$" is 1.125V.

Figure 3:
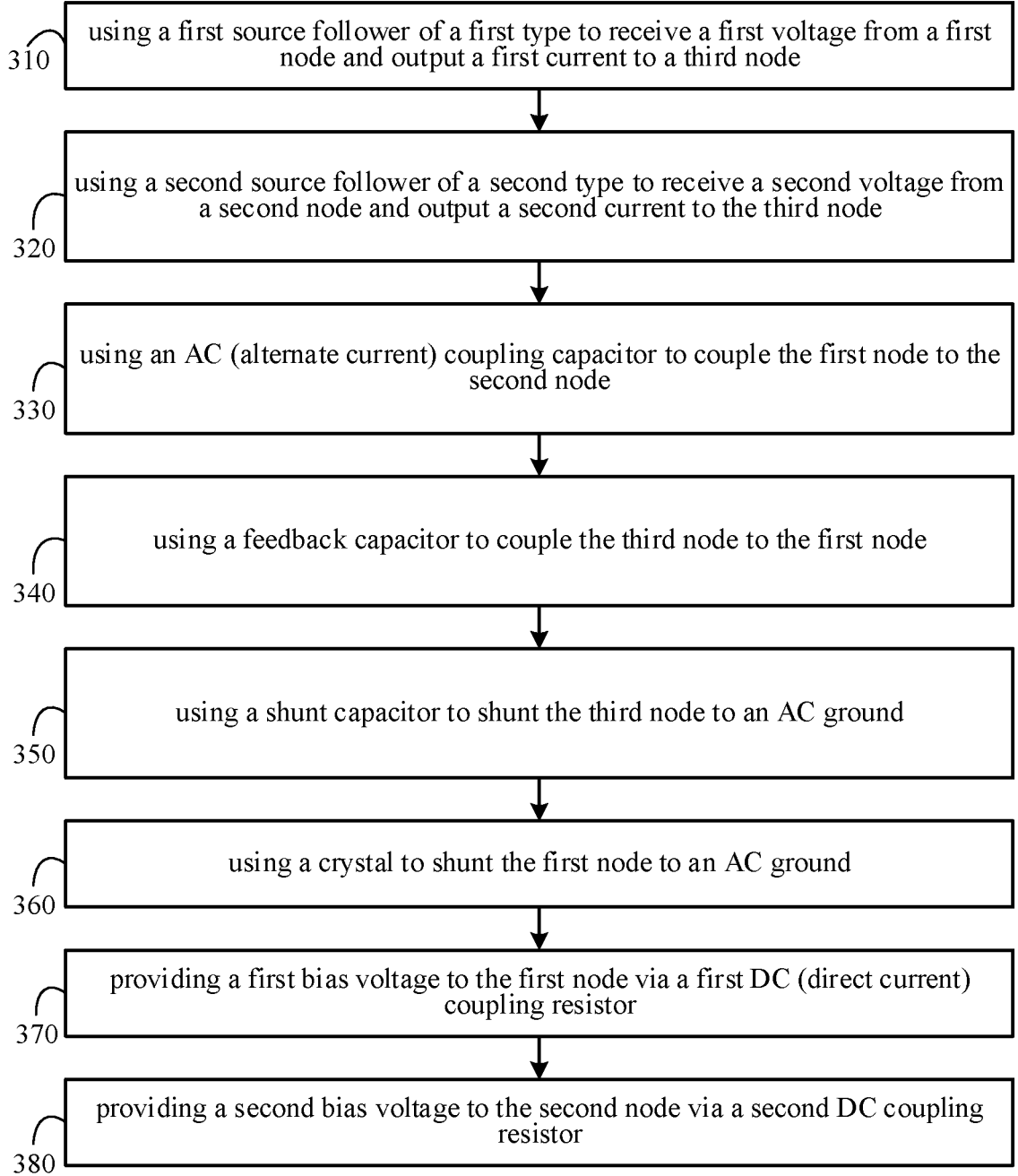
FIG. 3 shows a flow diagram of a method in accordance with an embodiment of the present invention.

As shown in a flow diagram 300 depicted in FIG. 3, a method in accordance with an embodiment of the present disclosure comprises: In an embodiment, a method comprises: (step 310) using a first source follower of a first type (i.e., either PMOS or NMOS) to receive a first voltage from a first node and output a first current to a third node; (step 320) using a second source follower of a second type (i.e., either NMOS or PMOS) to receive a second voltage from a second node and output a second current to the third node; (step 330) using an AC (alternate current) coupling capacitor to couple the first node to the second node; (step 340) using a feedback capacitor to couple the third node to the first node; (step 350) using a shunt capacitor to shunt the third node to an AC ground; (step 360) using a crystal to shunt the first node to an AC ground; (step 370) providing a first bias voltage to the first node via a first DC (direct current) coupling resistor; and (step 380) providing a second bias voltage to the second node via a second DC coupling resistor.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:
1. An oscillator comprising a crystal, a first source follower of a first type, a second source follower of a second type, an AC (alternate current) coupling capacitor, a feedback capacitor, a shunt capacitor, a first DC (direct current) coupling resistor, and a second DC coupling resistor, wherein:
   the first source follower of the first type comprises a first transistor of a first type, receives a first voltage from a first node, and outputs a first current to a third node;

the second source follower of the second type comprises a second transistor of a second type, receives a second voltage from a second node, and outputs a second current to the third node;

the AC coupling capacitor is configured to couple the first node to the second node;

the feedback capacitor is configured to couple the third node to the first node;

the shunt capacitor is configured to shunt the third node to an AC (alternate current) ground;

the crystal is configured to shunt the first node to the AC ground;

the first DC coupling resistor is configured to couple a first bias voltage to the first node; and the second DC coupling resistor is configured to couple a second bias voltage to the second node.

2. The oscillator of claim 1, wherein the first transistor is a PMOS (p-channel metal oxide semiconductor) transistor, and the second transistor is an NMOS (n-channel metal oxide semiconductor) transistor.

3. The oscillator of claim 1, wherein the first transistor is an NMOS (n-channel metal oxide semiconductor) transistor, and the second transistor is a PMOS (p-channel metal oxide semiconductor) transistor.

4. The oscillator of claim 1, wherein a resistance of the first DC coupling resistor is greater than an impedance of the first node looking into a gate node of the first source follower of the first type, while a resistance of the second DC coupling resistor is greater than an impedance of the second node looking into a gate node of the second source follower of the second type.

5. The oscillator of claim 1, wherein an impedance of the AC coupling capacitor is smaller than an input impedance looking into the second source follower of the second type.

6. A method comprising:
using a first source follower having a first transistor of a first type to receive a first voltage from a first node and output a first current to a third node;

using a second source follower having a second transistor of a second type to receive a second voltage from a second node and output a second current to the third node;

using an AC (alternate current) coupling capacitor to couple the first node to the second node;

using a feedback capacitor to couple the third node to the first node;

using a shunt capacitor to shunt the third node to an AC ground;

using a crystal to shunt the first node to the AC ground;

providing a first bias voltage to the first node via a first DC (direct current) coupling resistor; and providing a second bias voltage to the second node via a second DC coupling resistor.

7. The method of claim 6, wherein the first transistor is a PMOS (p-channel metal oxide semiconductor) transistor, and the second transistor is an NMOS (n-channel metal oxide semiconductor) transistor.

8. The method of claim 6, wherein a resistance of the first DC coupling resistor is greater than an impedance of the first node looking into a gate node of the first source follower of the first type, while a resistance of the second DC coupling resistor is greater than an impedance of the second node looking into a gate node of the second source follower of the second type.

9. The method of claim 6, wherein an impedance of the AC coupling capacitor is smaller than an input impedance looking into the second source follower of the second type.

10. The method of claim 6, wherein the first transistor is an NMOS (n-channel metal oxide semiconductor) transistor, and the second transistor is a PMOS (p-channel metal oxide semiconductor) transistor.

\* \* \* \* \*